United States Patent [19]

Suwa

[11] Patent Number: 4,770,533
[45] Date of Patent: Sep. 13, 1988

[54] APPARATUS FOR DETECTING POSITION OF AN OBJECT SUCH AS A SEMICONDUCTOR WAFER

[75] Inventor: Kyoichi Suwa, Yokohama, Japan
[73] Assignee: Nippon Kogaku K. K., Tokyo, Japan
[21] Appl. No.: 51,203
[22] Filed: May 18, 1987

Related U.S. Application Data

[62] Division of Ser. No. 772,469, Sep. 4, 1985, abandoned.

[30] Foreign Application Priority Data

Sep. 11, 1984 [JP] Japan ................................ 59-189991

[51] Int. Cl.$^4$ .............................................. G01B 11/00
[52] U.S. Cl. .................................... 356/375; 350/401
[58] Field of Search ...................... 356/375, 400, 401; 250/557, 561; 355/53

[56] References Cited

U.S. PATENT DOCUMENTS 4,200,395 4/1980 Smith et al. ......................... 356/356
4,311,389 1/1982 Fay et al. ............................. 356/400

Primary Examiner—F. L. Evans
Attorney, Agent, or Firm—Shapiro and Shapiro

[57] ABSTRACT

An apparatus for detecting a position of a semiconductor wafer comprises a linear alignment mark formed on a surface of the wafer along a pair of parallel straight lines extending in a given direction intersecting a radial direction of the wafer. The alignment mark includes at least two projection sections projected from the surface and spaced from each other in the given direction. Each of the projection sections has a first stepped edge provided on or along one of the pairs of straight lines and a second stepped edge provided on and along the other of the pair of straight lines, the pair of straight lines being separated from each other by a distance $d'$, and each of the projection sections being defined such that the following relationship is satisfied:

$$l' > d'$$

where $l'$ is the length of one of the projection sections in the given direction. A position of the alignment mark with respect to a direction intersecting the given direction is determined on the basis of light scattered by the first and second stepped edges.

14 Claims, 5 Drawing Sheets

OUTPUT LEVEL
OF DETECTOR
41, 51 OR 61

OUTPUT LEVEL
OF DETECTOR
42, 52 OR 62

FIG.12

APPARATUS FOR DETECTING POSITION OF AN OBJECT SUCH AS A SEMICONDUCTOR WAFER

This is a divisional application of Ser. No. 772,469, filed Sept. 4, 1985, now abandoned.

BACKGROUND OF THE INVENTION

1. Field of the Invention

The present invention relates to a photo-mask used in the exposure step of a process of making semiconductor elements and more particularly to such a photo-mask having a mark pattern for forming an alignment mark on a semiconductor wafer.

2. Description of the Prior Art

Semiconductor elements including LSI and the like are increasingly reduced in size and integrated with higher density. Exposure systems used in making semiconductor elements are thus required to provide more precise alignment. In such exposure systems, exposure is carried out when a mask or reticle is precisely placed over a semiconductor wafer on which a photosensitive agent or photoresist is applied. This requires detecting the position of an alignment mark on the wafer with high precision. Various proposals have been made with respect to the shape of the alignment mark and the detection of position of the same. One of various detection systems currently utilized can know the position of an alignment mark by detecting light information and particularly scattering light produced by the stepped edge of a linear mark. However, photoresist tends to be irregularly applied to the wafer at the stepped edges on the opposite sides of the linear mark. Such an irregularity of application causes light information from the stepped edges to be incorrect so that the precision in detection will substantially be decreased. In general, the application of photoresist is effected by the use of an apparatus known as a spinner that rotates a wafer at high speeds and drops liquid photoresist on the center of the wafer. The photoresist dropped on the wafer is spread toward the outer periphery of the wafer under the action of centrifugal force to form a film thereon. The thickness of the photoresist film is in the range of about 0.5 $\mu m$ to 2 $\mu m$ and depends on the rotational speed of the spinner, the viscosity of the photoresist used, etc. Such a method of applying the photoresist to the wafer can obtain a very uniform layer of photoresist through the entire surface of the wafer if there is no etched pattern on the wafer. If there is any uneven pattern on the surface of the wafer, however, the thickness of the photoresist layer becomes irregular near stepped edges of the pattern. When a raised or recessed mark line is desired, therefore, it may be better that the mark line be provided so as to extend radially from the center of the wafer. In such a case, the thickness of a photoresist layer formed becomes irregular at the stepped edges on the opposite sides of the mark line but substantially equally in irregularity. Thus, the central position of the mark line can accurately be detected when the positions of the opposite edges are detected. However, it is not really practicable to arrange all of mark lines to be formed on the wafer in accordance with such a rule. Particularly, where a plurality of alignment marks are formed on chips or dies on a wafer and each used to effect a two-dimensional alignment for each chip, the alignment marks may frequently extend perpendicular to the radial line from the center of the wafer or in a direction intersecting said radial line with a substantially large angle included therebetween, depending upon the positions of the respective chips on the wafer. Thus, the irregular thickness of the photoresist layer will become asymmetrical at the stepped edges on the opposite sides of each of the alignment marks. Consequently, the precision of detection will vary depending on the orientation of the respective alignment marks.

SUMMARY OF THE INVENTION

It is therefore an object of the present invention to provide a mask having a mark pattern used to form an alignment mark on a semiconductor wafer, which can apply photoresist to the wafer more uniformly such that the precision of alignment will be improved.

The present invention provides a mask having a mark pattern of a novel configuration which is extended in a given direction to form a linear alignment mark on a wafer. The mark pattern includes a plurality of mark pattern sections arranged in said given direction. Each of the mark pattern sections is characterized so that it satisfies the following relationship:

$$l > d$$

where l is the length of that mark pattern section and d is the width measured in the direction perpendicular to the length of the mark pattern section.

DESCRIPTION OF PREFERRED EMBODIMENTS

Figure 1:
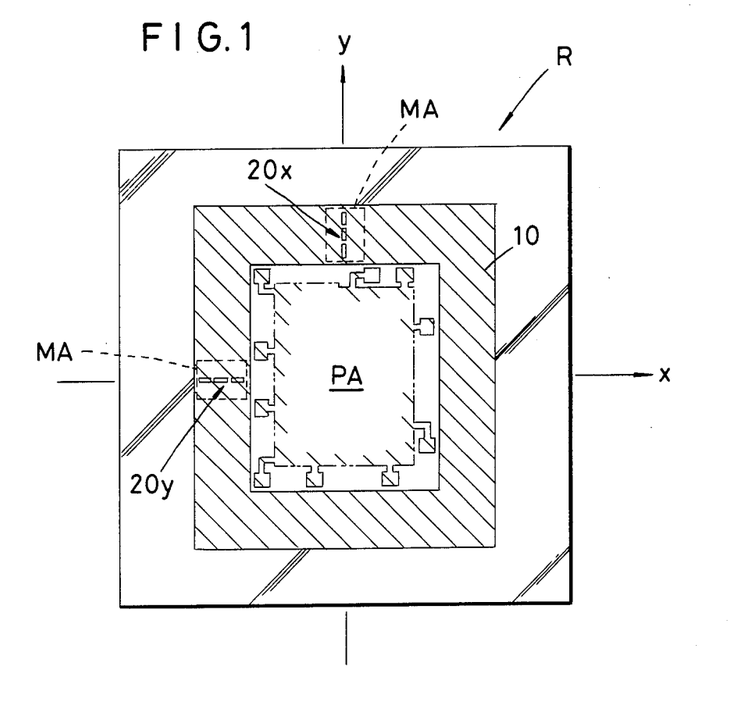
FIG. 1 is a plan view of a reticle according to the present invention.

Referring now to FIG. 1, there is shown a reticle R composed of a transparent substrate of glass and a film of light blocking material such as chromium patterned on the substrate into a desired plane configuration. The reticle R comprises a circuit pattern region PA, a light blocking zone 10 surrounding the region PA and light-transmissive mark patterns 20x and 20y formed within mark regions MA established at places in the light blocking zone 10. When the center of the pattern region PA is aligned with the origin of rectangular coordinates x-y, the mark pattern 20x will be a line (slit) longitudinally extending on the y-axis in the y-direction and the mark pattern 20y will be a line (slit) longitudinally extending on the x-axis in the x-direction. The mark patterns 20x and 20y are identical in configuration and size and are transferred to the wafer to use for detection and alignment in the x- and y-axes, respectively.

Figure 2:
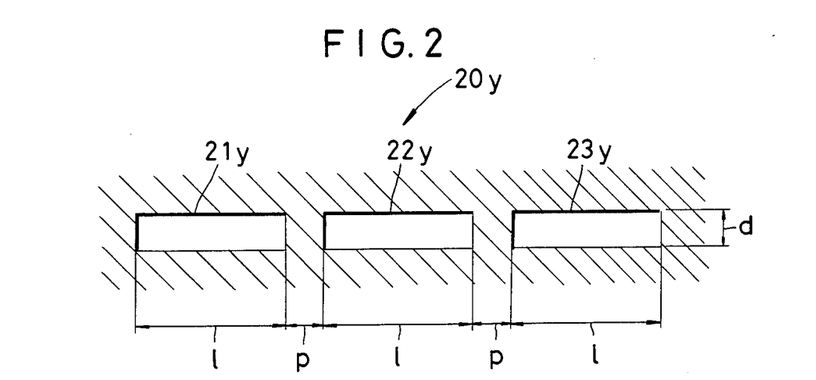
FIG. 2 is an enlarged view of a mark pattern on the reticle.

FIG. 2 shows the mark pattern 20y in an enlarged scale. The mark pattern 20y comprises three slit-like pattern sections 21y, 22y and 23y which are arranged endwise with a predetermined spacing between each pair of adjacent pattern sections. Each of the slit-like pattern sections has a width d and a length l. As is apparent in FIG. 2, opposite longitudinal edges of the pattern sections are defined by a pair of straight lines separted by a distance d. The spacing between adjacent pattern sections is represented by P. Although the length l or spacing P is not necessarily the same with respect to all the slit-like pattern sections, the total length 3l of the pattern sections 21y, 22y and 23y should sufficiently be larger than the total spacing 2P since the pattern sections must be detected on the wafer with high precision when the mark pattern 20y is transferred to the wafer. For example, when the mark pattern 20y is to be transferred to a wafer by the use of an exposure system having a magnification of transfer m (m=1/5 or 1/10 on a reduction projecting lens and m=1 on a real-size projecting lens), it is desirable that the image of each of the slit pattern sections formed on the wafer will have a length m·l of about 4 μm to 30 μm and a width m·d of about 3 μm to about 10 μm with a spacing between adjacent pattern images m·P of about 3 μm to 10 μm. The significance of these numerical values will be described hereinafter.

The mark patterns 20x and 20y may be formed as light blocking patterns within the light-transmissive mark region MA.

Figure 3:
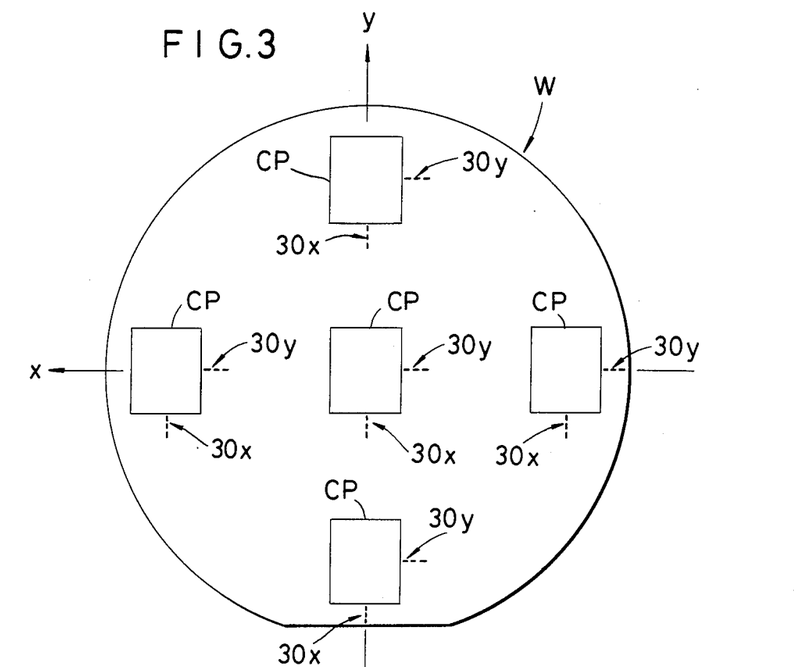
FIG. 3 is a plan view of a wafer subjected to exposure through the reticle shown in FIG. 1.
Figure 4:
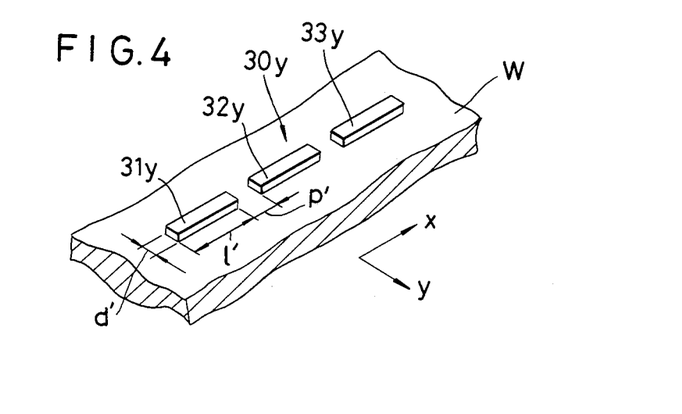
FIG. 4 is an enlarged perspective view of a mark formed on the wafer.

The reticle R is used to form a first layer on the wafer. In the illustrated embodiment, it is assumed that a reduction projector type exposure system known as a stepper is utilized to form a plurality of chips on a wafer by repeatedly exposing the same. First of all, a wafer on which a negative type photoresist is applied is placed on a wafer stage in the stepper. The wafer is then repeatedly subjected to exposure by stepping the wafer stage in a two-dimensional manner. At this time, the transparent portion of the reticle R outside the light blocking zone 10 is covered by a blind against exposure. Thus, the photoresist on the wafer is exposed to light passed through the light-transmissive portions on the reticle. In such a negative type photoresist, when the wafer is subjected to development, the portions of the photoresist layer exposed to light remain on the wafer and the other portions are removed. The developed wafer is then subjected to etching to a certain depth. After etching, the remaining photoresist layer portions on the wafer are removed, so that a raised pattern corresponding to the light-transmissive portions of the reticle will be formed on the wafer. As shown in FIG. 3, the resulting wafer W having the first layer formed thereon includes a matrix which comprises a plurality of chips CP corresponding to the pattern region PA of the reticle and marks 30x and 30y associated with each chip and extending in the x- and y-directions corresponding to the mark patterns 20x and 20y of the reticle, respectively. It is noted that FIG. 3 typically shows some of such chips CP. FIG. 4 shows a portion of the wafer W which includes one of the marks 30y. As in the mark 20y on the reticle, the mark 30y is of a raised pattern including three separate mark elements 31y, 32y and 33y. Each of the mark elements 31y, 32y and 33y on the wafer is of a length l' and a width d' with a spacing between each adjacent mark elements being P'. At a magnification of transfer equal to m, l'=m·l, d'=m·d and P'=m·P.

For exposure of a second and subsequent layers, photoresist is again applied to the wafer W. This application of photoresist is generally made by a spinner which drops liquid photoresist substantially on the center of the wafer rotated at a high speed. The dropped photoresist is spread toward the outer periphery of the wafer under the action of centrifugal force to form a film thereon. If the marks 30x and 30y extend on the wafer in the radial direction from the center thereof, the irregularity of the photoresist in thickness would be symmetrical at the stepped edges on the opposite sides of a mark which define the width d' thereof. If the marks 30x and 30y extend in a direction intersecting said radial direction, however, the irregularity of the photoresist in thickness would be different between the edge of a linear mark opposed to the outer periphery of the wafer and the other edge of the same mark opposed to the center of the wafer. In accordance with the present invention, such a problem can substantially be reduced by dividing a linear mark into a plurality of mark sections.

Figures 5A, 5B:
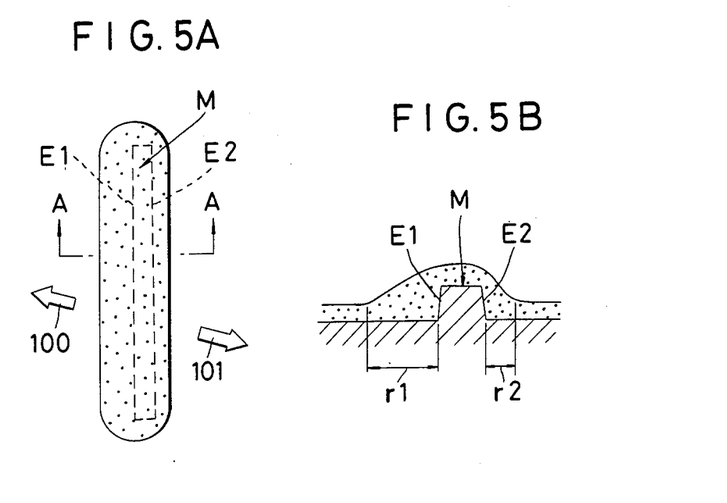
FIG. 5A is a plan view illustrating the application of photoresist on a linear mark in the prior art.
FIG. 5B is a cross-sectional view taken along a line A—A in FIG. 5A in the direction of the arrows.
Figures 6A, 6B:
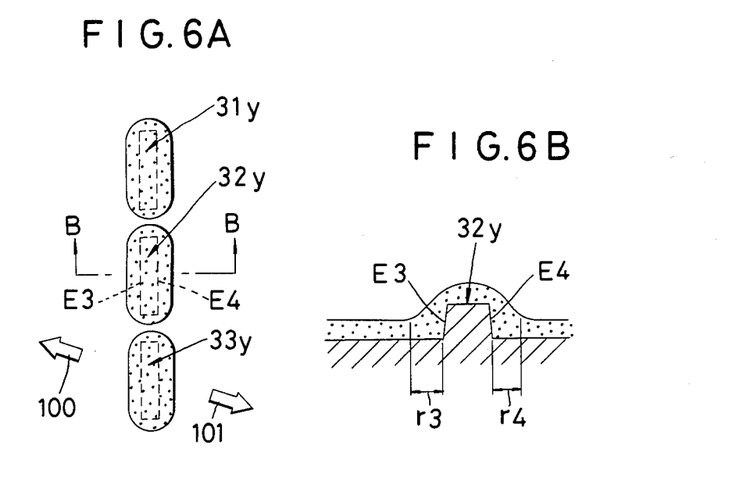
FIG. 6A is a plan view illustrating the application of photoresist o the mark of the present invention as shown in FIG. 4.
FIG. 6B is a cross-sectional view taken along a line B—B in FIG. 6A in the direction of the arrows.

FIGS. 5 and 6 illustrate the states of the photoresist which is applied to the wafer near a mark in accordance with the above-mentioned method. FIG. 5 shows the state of the applied photoresist on the conventional mark M while FIG. 6 shows the state of the applied photoresist on the mark 30y in an embodiment of the present invention.

In each of FIGS. 5A and 6A, a solid line enclosing a mark represents a contour line of a photoresist layer relative to the reference face of a wafer. It is assumed that the entire dimension of the prior art mark M is equal to that of the mark 30y according to the present invention. As shown in FIGS. 5A and 5B, the prior art mark M has a substantial difference between the width r1 of the irregular thickness of the photoresist applied to the wafer at an stepped edge E1 of the mark M in a direction 100 faced to the outer pheriphery of the wafer and the width r2 of the irregular thickness of the photoresist applied to the wafer at another stepped edge E2 of the same mark in another direction 101 faced to the rotational center of the wafer. On the other hand, as shown in FIGS. 6A and 6B, the mark 30y of the present invention has substantially no difference between the width r3 of the irregular thickness of the photoresist applied to the wafer at one stepped edge E3 of the mark 30y in the direction 100 opposed to the outer periphery of the wafer and the width r4 of the irregular thickness of the photoresist applied to the wafer at the other stepped edge E4 of the mark 30y in the other direction 101 opposed to the center of the wafer. This improvement is provided by the fact that the spacings between the mark sections 31y, 32y and 33y in the mark 30y serve as passageways which permit the liquid photoresist to spread from the center to the outer periphery of the wafer such that the photoresist will be less moved about and accumulated at the stepped edge E3 of the mark. In order that the widths r3 and r4 of the irregular thickness portions of the photoresist are equalized, it is preferable that the length l' of each of the mark sections be decreased as much as possible while the spacing P' between each adjacent mark sections be increased as far as possible. If this is done however, it is probable that the function of the mark will decrease substantially. If the length l' is less than 4 μm, the probability is greatly increased that each mark section will not be uniform at its corners due to etching and spattering during processing, so that it will not be useful as an alignment mark. Thus, the length l' is preferably in the range of about 4 μm to about 30 μm. Depending on the viscosity of a photoresist generally used (for example, OFP800), the thickness of the applied photoresist (1 μm to 1.5 μm), the rotational speed of the spinner and other parameters, the difference between the widths r3 and r4 will not be very large if the length l' is less than 30 μm. It is also desirable that the spacing P' is determined to be in the order of 3 μm to 10 μm depending on the viscosity of a photoresist used such that it can sufficiently pass therethrough. It appears that the minimum value of the spacing P' is determined in accordance with that of the width d' of the mark. Although it is desirable that the minimum value of the width d' be as small as possible to increase the precision in detection, it is more desirable that it be more than 3 μm, taking into account damage during processing. If the spacing P' is less than 3 μm when the width d' is equal to 3 μm, it is difficult to reduce the accumulation of the photoresist at the edges of the mark depending on the viscosity of the photoresist. This means that the values of the width d' and spacing P' are interrelated with the viscosity of the photoresist used. For example, if the minimum value of the spacing P' is equal to 3 μm while the width d' is more than 10 μm, the passage of the photoresist through the spacings would be degraded and the accumulation of the photoresist could not be improved in comparison with the linear mark in the prior art.

It is practicable that each of the marks 30x and 30y is of the entire length in the range of about 50 μm to about 200 μm and of a width in the range of about 3 μm to about 8 μm. Division of the linear mark into some mark sections is efficient for a mark having an increased length. Also with respect to a mark having the entire length less than 30 μm, the accumulation of the photoresist can effectively be prevented, for example, by separating the mark into two mark sections. For example, in such a system in which a spot of light in the form of a strip extending in the same direction as that in which the mark extends is scanned to detect scattering rays produced at stepped edges E1' and E2' of each mark section, the optimum dimensions of each of the mark sections are such that the width d' is of about 5 μm, the length l' is in the range of about 10 μm to 15 μm and the spacing P' is of about 4 μm.

Figure 7:
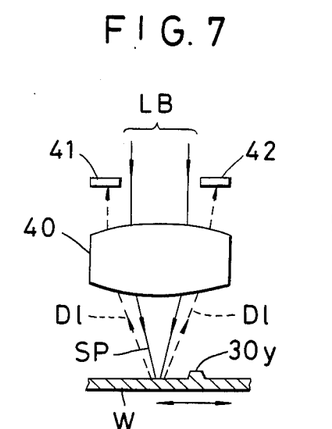
FIG. 7 is a schematic view illustrating an example of a mark detecting device.

The wafer to which the photoresist is thus applied is placed on a stage of the stepper. The marks 30x and 30y thereon are used to align this wafer with a reticle for the second layer. Some of mark detecting devices which can be used in the stepper are exemplified in FIGS. 7, 8 and 9. FIG. 7 shows a device of such a type that a beam of laser light LB is imaged as a striplike light spot SP on the wafer W through an objective 40. This device comprises photodetectors 41 and 42 adapted to receive scattering rays D1 produced at the stepped edges of the mark 30y through the objective 40 to detect the mark. Both the light spot SP and mark 30y extend in the direction perpendicular to a plane including the drawings. When the wafer is moved along the direction of the arrows to a position in which the photodetectors 41 and 42 detects scattering rays from the stepped edges of the mark 30y, the position of a stage is detected by the use of any suitable measuring device such as a laser interferometric measuring device.

Figure 8:
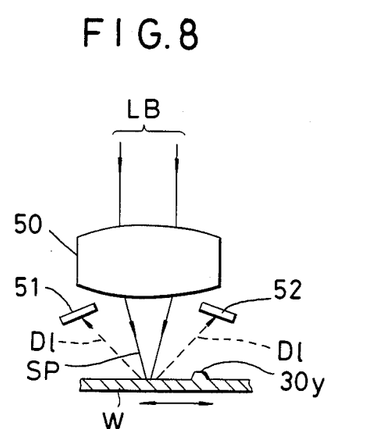
FIG. 8 is a schematic view illustrating another mark detecting device.

FIG. 8 shows another device of such a type that a beam of laser light LB is converged into a light spot SP through an objective 50. This device comprises photodetectors 51 and 52 adapted to receive scattering rays D1 generated at the stepped edges of the mark 30y with angles beyond the numerical aperture (NA) of the objective 50 located between the photodetectors 51 an 52. Similarly, the relative scan between the light spot SP and the mark 30y is carried out by moving the wafer W in the direction of the arrows.

Figure 9:
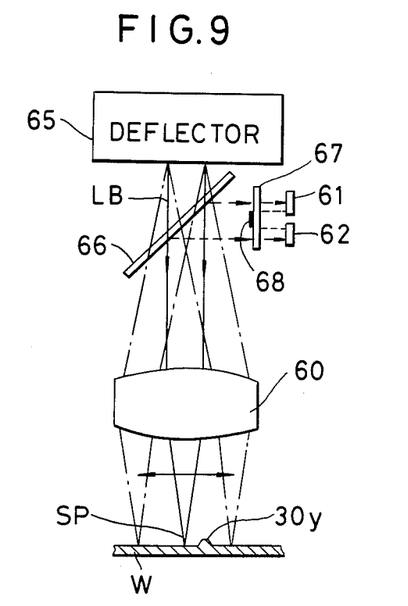
FIG. 9 is a schematic view illustrating still another mark detecting device.

A mark detecting device shown in FIG. 9 comprises an objective 60 and a deflector 65 a vibrating mirror, rotary polygonal mirror or acoustooptic modulator disposed at an equivalent position relative to the pupil of the objective 60. A laser beam LB is scanned by the deflector 65 and then introduced into the objective 60 through a beam splitter 66. The laser beam LB is imaged on the wafer W to form a light spot SP which is reciprocated transversely as viewed in FIG. 9 or scanned in a single direction. Scattering rays from the mark 30y are received by photodetectors 61 and 62 located at a position equivalent relative to the pupil of the objective 60, through the objective 60 and the beam splitter 66. A spatial filter 67 for blocking regular reflection rays of the light spot SP from the wafer W but transmitting scattering rays from the same is disposed forwardly of the light receiving faces of the photodetectors 61 and 62. Actually, this spatial filter 67 also is located at a position equivalent relative to the pupil of the objective 60. In such a system, the position of the mark 30y is detected by measuring a distance of scan of the light spot SP from a given point on the path of scan of the spotlight SP to a point at which the scattering rays from the mark 30y are initially detected by the photodetectors 61 and 62.

Figure 10:
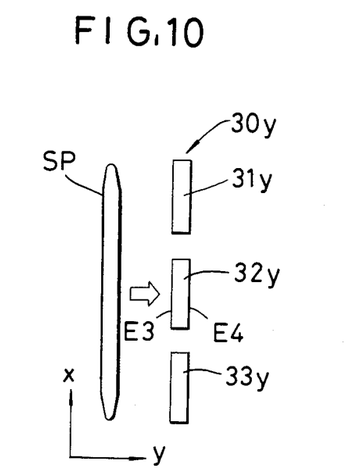
FIG. 10 is a plan view illustrating the alignment of the mark according to the present invention with a light spot.

In any event, a planar relationship between the light spot SP and the mark 30y is established such that they become parallel to each other, as shown in FIG. 10. In the illustrated embodiment, the mark 30y is positioned to be suitable for detection of the position of the wafer in the y-direction. Therefore, both the light spot SP and the mark 30y extend in the x-direction while the direction of relative scan is in the y-direction perpendicular to x-direction. When the width d' of the mark 30y in the direction of scan is equal to 5 μm and if the width of the light spot SP in the direction of scan is in the order of about 4 μm, the stepped edges E3 and E4 on the opposite sides of the mark can conveniently be detected as photoelectric signals separated from each other. The length of the light spot depends on the entire length of the mark. However, the light spot is not necessarily aligned accurately with the mark without deviation in the x-direction in the detection step, as shown in FIG. 10. It is therefore desirable that the entire length of the mark be larger than the length of the light spot, taking into account any deviation in the x-direction. As both the light spot and the mark are increased as far as possible, the detection will hardly be affected by any irregularity on the stepped edges of the mark such as a very small recess or ridge. Thus, the average capacity of detection can be improved. If the lengths of both the light spot and the mark are too large, the relationship between the mark and the light spot may be out of parallel, reducing to reduce the precision in detection.

Figure 11:
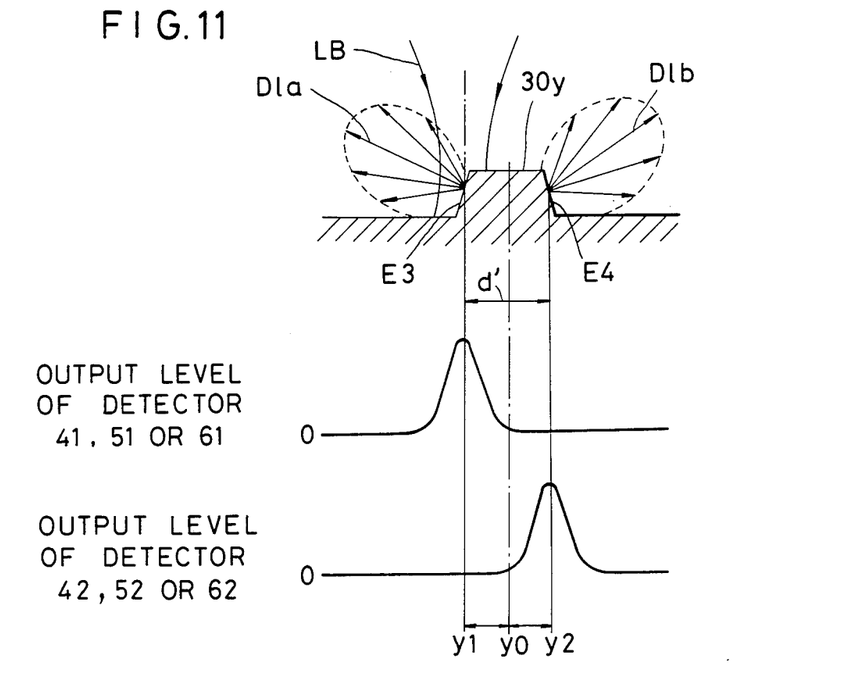
FIG. 11 illustrates scattering rays produced at the mark and waveforms of photoelectric signals associated therewith.

FIG. 11 illustrates the scattering rays produced from the relative scan between the light spot SP and the mark 30y and waveforms of the associated photoelectric signals. FIG. 11 shows the cross-section of the mark 30y in the direction of scan with the photoresist layers being omitted for simplification. As the center of the laser beam LB forming the light spot SP is aligned with the stepped edge E3 at a point y1, scattering rays D1a are produced in an air space faced to the stepped edge E3. At this point of time, the photodetector 41, 51 or 61 is in its peak output level. As the scan proceeds to align the center of the laser beam LB with the other stepped edge E4 at a point y2, scattering rays D1b are generated in an air space faced to this stepped edge E4. Thus, the photodetector 42, 52 or 62 is in its peak output level. A mark detecting circuit (not shown) will detect these two peak points y1 and y2 and then determine a position y0 equally spaced from both the points y1 and y2. This point y0 is in the center of the mark 30y in the y-direction and corresponds to a position on the mark to be determined. If the widths r3 and r4 of the irregular thickness of the photoresist are equal to each other as in FIG. 6B, therefore, the central point of the mark 30y can accurately be detected.

Figure 12:
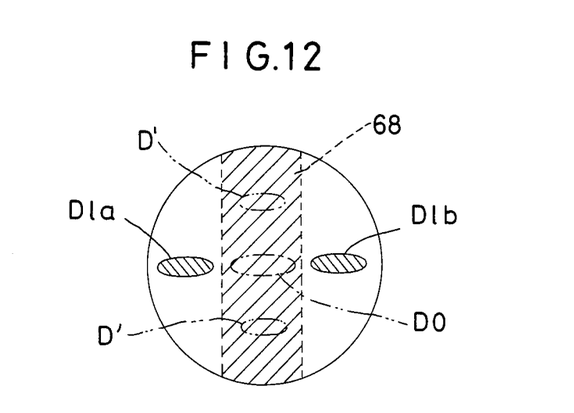
FIG. 12 illustrates a distribution of scattering rays on the pupil plane of an objective used in a mark detecting device.

FIG. 12 illustrates a distribution of the scattering rays on the pupil plane of the objective 60 or a plane equivalent to that pupil when the mark detecting device as shown in FIG. 9 is used to detect the scattering rays from the mark 30y. In FIG. 12, a circular region represents the pupil plane the center of which includes a strip-like hatched portion corresponding to the light blocking portion 68 of the spatial filter 67. Assuming that the position of the laser beam LB deflected by the deflector 65 is equivalent to the pupil plane of the objective 60, the regular reflection rays D0 from the wafer W will always pass through the center of the pupil irrespectively of the scanning of the laser beam LB. And also the scattering rays D1a and D1b from the respective stepped edges E3 and E4 pass through positions remote from the center of the pupil separately from the regular reflection rays D0. In the illustrated embodiment, the scattering rays D1a and D1b will pass through symmetrical points on the pupil relative to the point through which the regular reflection rays Do pass because of the stepped edges E3 and E4 arranged parallel to each other. Scattering rays D' from the edges of the mark 30y faced to the spacing between adjacent mark sections and not contributing to the detection of the mark pass through areas rotated 90 degrees about the center of the pupil from the scattering rays D1a and D1b. Thus, photoelectric signals as shown in FIG. 11 can be obtained by causing the light blocking portion 68 of the spatial filter 67 to block the regular reflection rays Do and the undue scattering rays D' and also by causing the photodetectors 61 and 62 to receive the scattering rays D1a and D1b, respectively.

So far as the aforementioned conditions are satisfied, each of the mark patterns on the reticle may be divided into any number of sections. Furthermore, each of the mark patterns is not necessarily divided into sections spaced equally away from one another. The spacing between each pair of adjacent mark sections is not always required to be constant.

Although there has been described a typical embodiment in which the mark patterns are provided in two mark regions MA on the reticle, three or more mark patterns may be used on the reticle, if desired. For example, a pattern having the same configuration as that of the mark pattern 20y is preferably provided at a point symmetrically with respect to the y-axis to detect a deviation of chips transferred to a wafer in the direction of rotation. Moreover, two patterns each having the same configuration as that of the mark pattern 20x are preferably provided symmetrically with respect to the y-axis to measure errors in expansion and contraction of the chips or in the magnification of projection.

I claim:

1. An apparatus for detecting a position of an object comprising:
    a linear alignment mark formed on a surface of said object along a pair of parallel straight lines extending in a given direction;
    said alignment mark including at least two projection sections projected from said surface and spaced from each other in said given direction;
    each of said projection sections having a first stepped edge provided on and along one of said pair of straight lines and a second stepped edge provided on and along the other of said pair of straight lines, said pair of straight lines being separated from each other by a distance d', and each on said projection sections being defined such that the following relationship is satisfied:

$$l' > d'$$

where l' is the length of one of said projection sections in said given direction;
    means for supplying a light beam toward said alignment mark; and
    means for determining a position of said alignment mark with respect to a direction intersecting said given direction on the basis of light scattered by said first and second stepped edges.

2. An apparatus according to claim 1, wherein said supplying means forms a strip-like light spot elongated in said given direction on said surface of said object.

3. An apparatus according to claim 2, wherein said supplying means includes means for causing a relative displacment between said strip-like light spot and said object in said intersecting direction.

4. An apparatus according to claim 1, wherein said determining means includes light receiving means provided to receive the scattered light of said light beam and to generate a corresponding output, and determines said position of said alignment mark on the basis of said output.

5. An apparatus according to claim 1, wherein said two projection sections are arranged such that a relationship between the length l' in said given direction and a spacing P' between said projection sections is:

$$l' > P'$$

6. An apparatus according to claim 1, wherein said alignment mark includes at least three projection sections spaced from one another in said given direction, each of said projection sections being defined such that the total length of all the projection sections in said given direction is larger than the total of the spacings between said projection sections.

7. An apparatus for detecting a position of a semiconductor wafer, comprising:

a linear alignment mark formed on a surface of said wafer along a pair of parallel straight lines extending in a given direction intersecting a radial direction of said wafer;

said alignment mark including at least two projection sections projected from said surface and spaced from each other in said given direction;

each of said projection sections having a first stepped edge provided on and along one of said pair of straight lines and a second stepped edge provided on and along the other of said pair of straight lines, said pair of straight lines being separated from each other by a distance d', and each of said projection sections being defined such that the following relationship is satisifed:

$$l' > d'$$

where l' is the length of one of said projection sections in said given direction;

means for supplying a light beam toward said alignment mark; and means for determining a position of said alignment mark with respect to a direction intersecting said given direction on the basis of light scattered by said first and second stepped edges.

8. An apparatus according to claim 7, wherein said supplying means forms a strip-like light spot elongated in said given direction on said surface of said wafer.

9. An apparatus according to claim 8, wherein said supplying means includes means for causing a relative displacement between said strip-like light spot and said wafer in said intersecting direction.

10. An apparatus according to claim 7, wherein said determining means includes light receiving means provided to receive the scattered light of said light beam and to generate a corresponding output, and determines said position of said alignment mark on the basis of said output.

11. An apparatus according to claim 7, wherein said length l' is in the range of 4 μm to 30 μm and said distance d' is in the range or 3 μm to 10 μm.

12. An apparatus according to claim 11, wherein said projection sections are separated from each other in said given direction by a distance in the range of 3 μm to 10 μm.

13. An apparatus according to claim 7, wherein said two projection sections are arranged such that a relationship between the length l' in said given direction and a spacing P' between said projection section is:

$$l' > P'.$$

14. An apparatus according to claim 7, wherein said alignment mark includes at least three projection sections spaced from one another in said given direction, each of said projection sections being defined such that the total length of all the projection sections in said given direction is larger than the total of the spacings between said projection sections.

* * * * *